United States Patent
Hera et al.

(10) Patent No.: US 10,049,686 B1
(45) Date of Patent: Aug. 14, 2018

(54) AUDIO SYSTEMS AND METHOD FOR PERTURBING SIGNAL COMPENSATION

(71) Applicant: BOSE CORPORATION, Framingham, MA (US)

(72) Inventors: Cristian M. Hera, Lancaster, MA (US); Jeffery R. Vautin, Worcester, MA (US); Elie Bou Daher, Marlborough, MA (US); Paraskevas Argyropoulos, Everett, MA (US); Vigneish Kathavarayan, Marlborough, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/431,029

(22) Filed: Feb. 13, 2017

(51) Int. Cl.
*G10L 21/0232* (2013.01)
*H03G 5/16* (2006.01)
*H04R 1/40* (2006.01)
*G10L 21/0364* (2013.01)
*G10L 25/78* (2013.01)
*H04R 1/02* (2006.01)
(Continued)

(52) U.S. Cl.
CPC ...... *G10L 21/0232* (2013.01); *G10L 21/0364* (2013.01); *G10L 25/78* (2013.01); *H03G 5/165* (2013.01); *H04R 1/025* (2013.01); *H04R 1/406* (2013.01); *H04R 3/04* (2013.01); *G10L 2021/02082* (2013.01); *G10L 2021/02166* (2013.01); *H04R 2499/13* (2013.01)

(58) Field of Classification Search
None
See application file for complete search history.

(56) References Cited

U.S. PATENT DOCUMENTS 6,363,156 B1 * 3/2002 Roddy ................ H04B 1/3822
381/71.4
6,505,057 B1 1/2003 Finn et al.
(Continued)

FOREIGN PATENT DOCUMENTS

EP 1475997 A2 11/2004

OTHER PUBLICATIONS

Bitzer et al., "Superdirective Microphone Arrays," Microphone Arrays: Signal Processing Techniques and Applications, 2001, pp. 19-38, Springer.
(Continued)

*Primary Examiner* — Paul Huber
(74) *Attorney, Agent, or Firm* — Lando & Anastasi, LLP

(57) ABSTRACT

Audio systems and methods for providing intelligible audio content within a vehicle cabin. In one example, the audio system includes a first speaker to provide first audio content to a first seating position based on an audio signal received from an audio signal source, a second speaker to provide second audio content to a second seating position, a first microphone assembly positioned to detect speech content originating at the second seating position, leaked second audio content from the second speaker, and road noise, and audio signal processing circuitry configured to determine a perturbing signal based at least in part on a combination of the first speech content, the leaked second audio content, and the road noise, and adjust the audio signal to the first speaker to compensate for an effect of the perturbing signal on the first audio content at the first seating position.

22 Claims, 4 Drawing Sheets

(51) Int. Cl.
*H04R 3/04* (2006.01)
*G10L 21/0216* (2013.01)
*G10L 21/0208* (2013.01)

(56) References Cited

U.S. PATENT DOCUMENTS

| | | | |
|---|---|---|---|
| 6,674,865 B1 | 1/2004 | Venkatesh et al. | |
| 6,980,663 B1* | 12/2005 | Linhard | G10L 21/0208 |
| | | | 381/77 |
| 7,171,003 B1* | 1/2007 | Venkatesh | H03G 3/32 |
| | | | 381/66 |
| 9,595,253 B2* | 3/2017 | Inoue | G10K 11/1786 |
| 9,773,495 B2* | 9/2017 | MacNeille | G10K 11/1786 |
| 2002/0071573 A1 | 6/2002 | Finn | |
| 2010/0189275 A1* | 7/2010 | Christoph | H04R 3/005 |
| | | | 381/66 |
| 2015/0281864 A1 | 10/2015 | Song et al. | |
| 2016/0174010 A1* | 6/2016 | Mohammad | H04R 5/02 |
| | | | 381/302 |
| 2016/0196818 A1 | 7/2016 | Christoph | |

OTHER PUBLICATIONS

Arslan et al., "New Methods for Adaptive Noise Suppression", In Proc. IEEE Int. Conf. Acoust., Speech, Signal Processing, May 1995.
Benesty et al., "A Better Understanding and an Improved Solution to the Specific Problems of Stereophonic Acoustic Echo Cancellation", IEEE Transactions on Speech and Audio Processing, vol. 6, No. 2, Mar. 1998, pp. 156-165.
International Search Report and Written Opinion for International Application No. PCT/US2018/017774 dated Apr. 5, 2018.

* cited by examiner

AUDIO SYSTEMS AND METHOD FOR PERTURBING SIGNAL COMPENSATION

TECHNICAL FIELD

Aspects and implementations of the present disclosure are directed generally to audio systems, and in some examples, more specifically to audio systems for providing an improved listening experience in a vehicle.

BACKGROUND

Traditional vehicle audio systems deliver common audio content to all passengers of a vehicle irrespective of passenger occupancy within the vehicle. In such systems, an audio signal supplied by a vehicle radio (or other signal source) is amplified, processed, and corresponding acoustic energy is delivered through the speakers to convey audio content to the occupants of the vehicle. More recently, modern vehicle audio systems have been designed to customize audio content for each seating position within the vehicle. In such systems, each seating position may receive the same audio content, or receive personalized audio content. Regardless of the configuration, in many cases, the presence of perturbing signals within the vehicle degrades the fidelity of the audio content and can be an annoyance for the occupants of the vehicle.

SUMMARY

In accordance with an aspect of the present disclosure, there is provided an audio system which compensates for one or more perturbing signals within a vehicle cabin to provide intelligible audio content for at least one intended location within the vehicle. Specifically, the perturbing signal may include road noise, leaked audio content from interfering speakers, and/or speech content from locations within the vehicle. Based on at least the perturbing signal, the audio system may adjust the audio content for the intended location such that the road noise, leaked audio content, and/or speech content has substantially no effect on the intelligibility of the audio content. Such aspects and implementations are particularly advantageous when included in vehicles having at least two rows of seats, where noise, leaked audio content, and speech content from the rear of the vehicle may undesirably interfere with audio content delivered to a seat in the front of the vehicle (or vice versa).

According to an aspect, provided is a vehicle cabin audio system. In one example, the vehicle cabin audio system comprises a first speaker positioned to provide first audio content to a first seating position within a vehicle cabin based on an audio signal received from an audio signal source, a second speaker positioned to provide second audio content to a second seating position within the vehicle cabin, a first microphone assembly positioned to detect first speech content originating at the second seating position, leaked second audio content from the second speaker, and road noise, and audio signal processing circuitry coupled to at least the first microphone assembly and configured to determine a perturbing signal based at least in part on a combination of the first speech content, the leaked second audio content from the second speaker, and the road noise, and adjust the audio signal to the first speaker based on a frequency of the audio signal to compensate for an effect of the perturbing signal on the first audio content at the first seating position.

According to an example, the vehicle cabin audio system may further comprise a second microphone assembly positioned to detect at least second speech content originating at a third seating position, the second speech content being different from the first speech content, wherein the audio signal processing circuitry is coupled to the second microphone assembly and further configured to determine the perturbing signal based on the second speech content. In one example, the second audio content is different from the first audio content, and the second seating position is in one of a forward facing direction, a rearward facing direction, a first sideways facing direction, or a second sideways facing direction of the first seating position. According to an example, each of the first microphone assembly and the second microphone assembly includes an array of microphones.

In at least one example, the audio signal processing circuitry is configured to filter the leaked second audio content from the second speaker and the road noise to isolate the first speech content. According to various examples, the first microphone assembly is further configured to detect the second speech content, and the audio signal processing circuitry is configured to distinguish the first speech content detected by the first microphone assembly from the second speech content detected by the first microphone assembly based on a direction of each of the first speech content and the second speech content relative to the first microphone assembly.

According to various examples, the first microphone assembly is further configured to detect the second speech content, and the audio signal processing circuitry is further configured to select and apply a first beamforming configuration to attenuate the second speech content detected by at least the first microphone assembly. In one example, the beamforming configuration includes at least a set of weight vectors, and in applying the first beamforming configuration the audio signal processing circuitry is configured to apply the set of weight vectors to a combination of the first speech content and the second speech content. In a further example, the vehicle cabin audio system further comprises a data store including a look-up table having a plurality of beamforming configurations, and the audio signal processing circuitry is configured to reference the look-up table to select the first beamforming configuration from among the plurality of beamforming configurations.

In various examples, the audio signal processing circuitry includes volume-based equalization circuitry configured to control an attenuation or amplification applied to the audio signal to the first speaker to adjust the audio signal to compensate for the effect of the perturbing signal. In one example, the audio signal includes at least a first frequency band and a second frequency band, and the volume-based equalization circuitry is configured to control a first attenuation or amplification applied to the first frequency band and a second attenuation or amplification applied to the second frequency band, the first attenuation or amplification being different from the second attenuation or amplification. In an example, the volume-based equalization is configured to control an attenuation or amplification applied to the audio signal independently for each frequency of the audio signal. In one example, the first seating position is a driver's seat within the vehicle cabin, and the first audio content is a telephone conversation.

According to an aspect, provided is a vehicle cabin audio system. In one example, the vehicle cabin audio system comprises a first speaker positioned to provide first audio content to an occupant within a vehicle cabin based on an audio signal received from an audio signal source, a plurality of microphone assemblies positioned to detect speech content originating at a corresponding seating position within the vehicle cabin, other speech content from the other seating positions within the vehicle cabin, road noise, and leaked audio content, and audio signal processing circuitry coupled to each of the plurality of microphone assemblies and configured to attenuate or reject the other speech content, road noise, and leaked audio content and estimate at least one speech signal for the speech content from each of the corresponding seating positions.

In one example, the plurality of microphone assemblies includes at least a first microphone assembly and a second microphone assembly, and the speech content from the seating position corresponding to the first microphone assembly includes first speech content and the speech content from the seating position corresponding to the second microphone assembly includes second speech content. According to an example, the audio signal processing circuitry is configured to select and apply a first beamforming configuration to a combination of the first speech content and the second speech content detected by at least the first microphone assembly.

In various examples, the first beamforming configuration includes at a least first set of weight vectors, and in applying the first beamforming configuration the audio signal processing circuitry is configured to apply the first set of weight vectors to the combination of the first speech content and the second speech content to reject or attenuate the second speech content. In an example, the audio signal processing circuitry is configured to select and apply a second beamforming configuration to a combination of the first speech content and the second speech content detected by at least the second microphone assembly. According to an example, the second beamforming configuration includes a second set of weight vectors, and in applying the second beamforming configuration the audio signal processing circuitry is configured to apply the second set of weight vectors to the combination of the first speech content and the second speech content to reject or attenuate the first speech content.

In some examples, the audio signal processing circuitry is further configured to adjust the audio signal to compensate for an effect of the estimated speech signal for the speech content from each of the corresponding seating positions on the first audio content. In an example, the audio signal processing circuitry includes volume-based equalization circuitry configured to control an attenuation or amplification applied to the audio signal to the first speaker to compensate for the effect of the estimated speech signal.

According to another aspect, provided is a method of operating a vehicle cabin audio system. In one example, the method comprises the acts of providing first audio content to a first seating position within a vehicle cabin, with a first speaker, based on an audio signal received from an audio signal source, providing second audio content to a second seating position within the vehicle cabin with a second speaker, detecting, at a first microphone assembly, first speech content originating at the second seating position, leaked second audio content from the second speaker, and road noise, determining a perturbing signal based at least in part on a combination of the first speech content, the leaked second audio content from the second speaker, and the road noise, and adjusting the audio signal based on a frequency of the audio signal to compensate for an effect of the perturbing signal on the first audio content at the first seating position.

In one example, the method further comprises the acts of detecting, at a second microphone assembly, second speech content originating at a third seating position, the second speech content being different from the first speech content, and determining the perturbing signal based on the second speech content. According to an example, the method further comprises the act of filtering the leaked second audio content from the second speaker and the road noise to isolate the first speech content. In one example, the method further comprises the acts of detecting, at the first microphone assembly, the second speech content, and distinguishing between the first speech content detected by the first microphone assembly and the second speech content detected by the first microphone assembly based on a direction of each of the first speech content and the second speech content relative to the first microphone assembly.

According to various examples, the method further comprises the acts of detecting, at the first microphone assembly, the second speech content, and selecting and applying a first beamforming configuration to attenuate the second speech content detected by at least the first microphone assembly. In one example, applying the first beamforming configuration includes applying a set of weight vectors to a combination of the first speech content and the second speech content to reject or attenuate the second speech content.

In one example, the audio signal includes at least a first frequency band and a second frequency band, and adjusting the audio signal includes controlling a first attenuation or amplification applied to the first frequency band and a second attenuation or amplification applied to the second frequency band, the first attenuation or amplification being different from the second attenuation or amplification. In an example, adjusting the audio signal includes controlling an attenuation or amplification applied to the audio signal independently for each frequency of the audio signal.

Still other aspects, examples, and advantages of these exemplary aspects and examples are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Various aspects and examples described herein may include means for performing any of the described methods or functions.

Furthermore, in the event of inconsistent usages of terms between this document and documents incorporated herein by reference, the term usage in the incorporated references is supplementary to that of this document; the term usage in this document controls. In addition, the accompanying drawings are included to provide illustration and a further understanding of the various aspects and examples, and are incorporated in and constitute a part of this specification. The drawings, together with the remainder of the specification, serve to explain principles and operations of the described and claimed aspects and examples.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1:
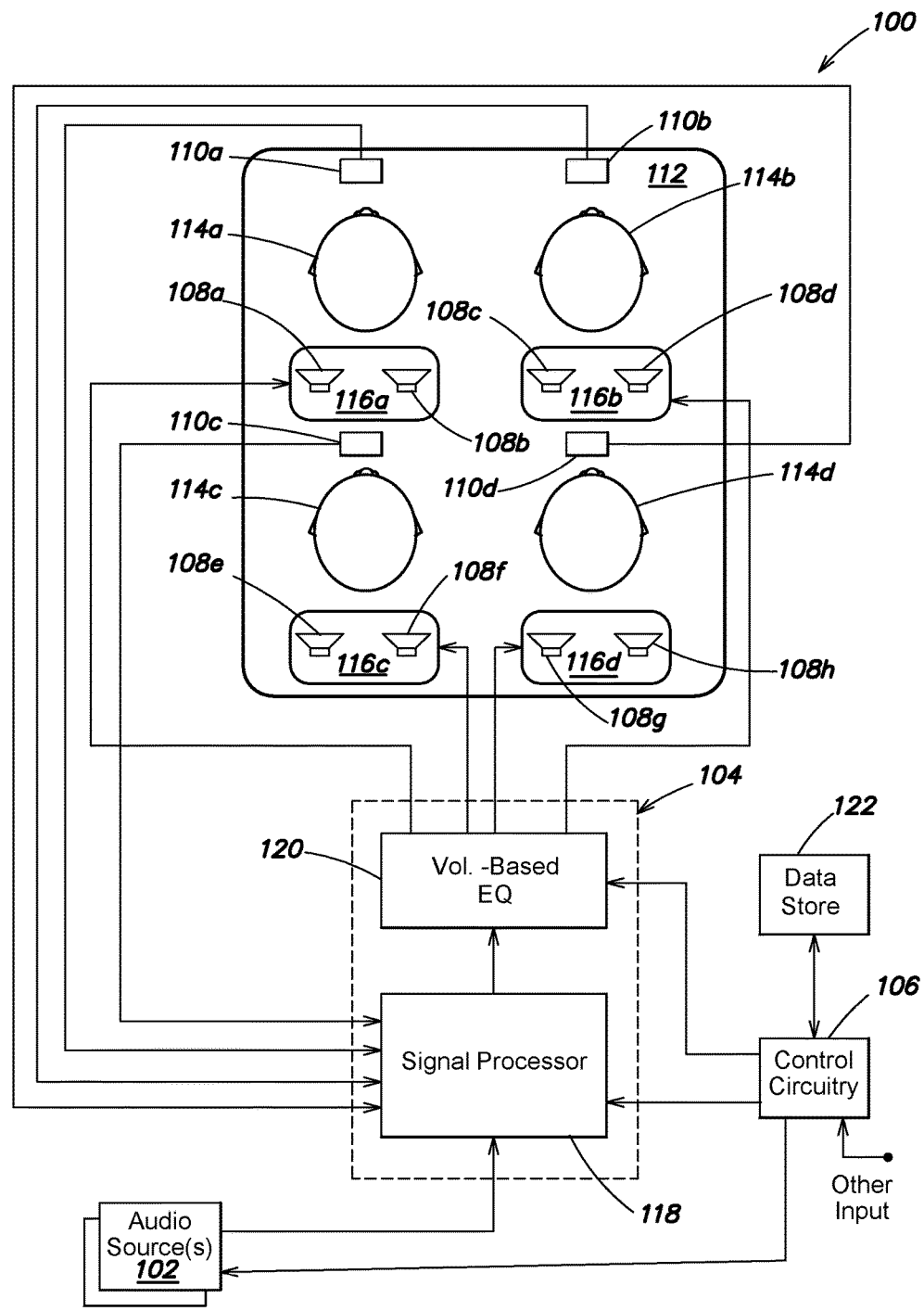
FIG. 1 is a schematic view of a vehicle cabin audio system according to various examples.

Aspects and examples discussed herein are generally directed to an audio system for a vehicle cabin that provides intelligible audio content to a desired location within the vehicle cabin despite the presence of speech content (e.g., a conversation) within the vehicle cabin. According to certain examples, the audio system may include one or more microphone assemblies which detect speech content within the vehicle cabin, and audio signal processing circuitry which determines a perturbing signal based on the speech content and other acoustic interference (e.g., road noise and/or leaked audio content) within the vehicle cabin. Based on the perturbing signal, the audio signal processing circuitry adjusts audio content delivered to the desired location (e.g., a seating position) to mitigate the effects of the speech content and other acoustic interference on the audio content.

Accordingly, various aspects and examples discussed herein concurrently compensate for numerous types of interference (e.g., speech content, road noise, and leaked auto content) to provide a dynamic range of noise compensation functionality. Among the various other benefits discussed herein, certain aspects and examples of the vehicle cabin audio systems provided herein improve the listening experience and sound quality of audio content delivered to a vehicle occupant when compared to traditional audio systems.

It is to be appreciated that examples of the systems and methods discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Though the elements of several views of the drawings herein may be shown and described as discrete elements in a block diagram and may be referred to as "circuit" or "circuitry," unless otherwise indicated, the elements may be implemented as one of, or a combination of, analog circuitry, digital circuitry, or one or more microprocessors executing software instructions. For example, software instructions may include digital signal processing (DSP) instructions to be executed by a digital signal processor. Unless otherwise indicated, signal lines may be implemented as discrete analog or digital signal lines, as a single discrete digital signal line with appropriate signal processing to process separate streams of audio signals, or as elements of a wireless communication system.

Some of the processing operations discussed herein may be expressed in terms of determining, adjusting, filtering, distinguishing, and/or controlling, to name a few. The equivalent of determining, adjusting, filtering, distinguishing, and/or controlling can be performed by either analog or digital signal processing techniques and are included within the scope of this disclosure. Unless otherwise indicated, audio signals may be encoded in either digital or analog form; conventional digital-to-analog or analog-to-digital converters may not be shown in the figures but are intended to be within the scope of this disclosure.

Various examples of the vehicle cabin audio systems discussed herein can be utilized in combination with speakers which provide discrete audio content zones at different seating positions within a listening area, such as a vehicle cabin. While the audio systems are shown and described herein as being incorporated within a vehicle cabin having four seating positions, it is appreciated that in various other implementations the audio systems may be adapted for vehicle cabins having other seating arrangements and/or other listening spaces which accommodate multiple occupants, such as theaters, auditoriums, and amusement park rides, to name a few.

Referring to FIG. 1, illustrated is one example of a vehicle cabin audio system ("audio system") 100 according to certain aspects. As illustrated, the audio system 100 may include an audio signal source 102, audio signal processing circuitry 104, control circuitry 106, one or more speakers 108a-h, and one or more microphone assemblies 110a-d, among other components. FIG. 1 illustrates the vehicle cabin 112 as including a first seating position 114a, a second seating position 114b, a third seating position 114c, and a fourth seating position 114d. In particular instances, the first seating position 114a may include a driver's seat within a first row of seats of the vehicle cabin 112, the second seating position 114b may include a front passenger's seat within the first row of seats, the third seating position 114c may include a first rear passenger's seat within a second row of seats of the vehicle cabin 112, and the fourth seating position 114d may include a second rear passenger's seat within the second row of seats. Unless otherwise specified, the one or more speakers 108a-h are generally referred to as speakers 108, the one or more microphone assemblies 110a-d are generally referred to as microphone assemblies 110, and the seating positions 114a-d are generally referred to as seating positions 114.

Each of the speakers 108 may be positioned proximate a corresponding seating position 114. In particular, the speakers 108a, 108b are positioned to provide audio content to the first seating position 114a, the speakers 108c, 108d are positioned to provide audio content to the second seating position 114b, the speakers 108e, 108f are positioned to provide audio content to the third seating position 114c, and the speakers 108g, 108h are positioned to provide audio content to the fourth seating position 114d. While in certain examples, each speaker 108 may include a "near-field speaker" (or near-field speaker array) located near a head position of an occupant of a corresponding seating position 114, any suitable speaker and arrangement may be used. That is, while FIG. 1 illustrates an example where each seating position 114a, 114b, 114c, 114d has a pair of corresponding speakers, in certain other examples, each seating position 114a, 114b, 114c, 114d, may include more or less than the illustrated pair of corresponding speakers 108. Moreover, the speakers 108 may be arranged in locations other than those illustrated in FIG. 1. For example, speakers 108 may be positioned in one or more of a headrest, a seat back, an armrest, a door of the vehicle cabin 112, a headliner, and/or an instrument panel, to name a few examples.

In the shown example of FIG. 1, each of the speakers 108 are incorporated within the headrest of the corresponding seating position 114. That is, the speakers 108a, 108b may be positioned within a headrest 116a of the first seating position 114a, the speakers 108c, 108d may be positioned within a headrest 116b of the second seating position 114b, the speakers 104e, 104f may be positioned within a headrest 116c of the third seating position 114c, and the speakers 104g, 104h may be positioned within a headrest 116d of the fourth seating position 114d. Each speaker 108 of the audio system 100 may include a directional loudspeaker including a cone-type acoustic driver. However, in various other implementations the speakers 108 may include directional loudspeakers of a type other than cone-types, such as dome-types, flat-panel type, or any other suitable forward firing electro-acoustic transducer.

In various examples, the audio signal source 102 is coupled to the audio signal processing circuitry 104 and configured to provide one or more audio signals. The audio signal source 102 may include one or more audio components of a vehicle sound system (e.g., car radio), an MP3 player, a CD player, a cell phone, or a mobile device, to name a few. The audio signal source 102 may be integral to the audio system 100, or may be external and communicate via a communication interface with the audio system 100. In certain examples, the audio signal source 102 may include a separate audio source designated for each seating position 114 or audio content zone within the vehicle (e.g., a first audio content zone for the seating positions 114a, 114b and a second audio content zone for the seating positions 114c, 114d).

According to various examples, the audio signal processing circuitry 104 receives the audio signal(s) from the audio signal source 102, performs one or more signal processing operations on the received audio signal(s), and delivers the processed audio signal(s) to the respective speaker 108. Once received, the audio signal drives the respective speaker 108 to provide audio content to the corresponding seating position 114 based on the received audio signal. As further described below, in particular examples, the audio signal processing circuitry 104 may include a signal processor (e.g., a Digital Signal Processor (DSP)) 118 and volume-based equalization circuitry 120, among other components.

In certain other examples, the audio signal processing circuitry 104 may include additional circuitry not illustrated for the convenience of explanation. For instance, the audio signal processing circuitry 104 can include a wireless component having hardware or software configured to receive the audio signal via a wireless protocol such as BLUETOOTH®, Bluetooth Low Energy (BLE), WiFi, Zigbee, or Propriety Radio. As used herein, BLUETOOTH® refers to a short range ad hoc network, otherwise known as piconets.

In further examples, the wireless component may include hardware or software to support both BLUETOOTH® and Bluetooth Low Energy.

As further illustrated in the example of FIG. 1, the control circuitry 106 is coupled to at least the audio signal processing circuitry 104 and the audio signal source 102. In response to an input (e.g., user input), the control circuitry 106 provides one or more audio source selection signals to the audio signal source 102 selecting the particular audio content for each seating position 114 (or audio content zone). As discussed above, the control circuitry 106 may select the same audio signal source 102 for each seating position 114, or may select a combination of different audio signal sources 102 for different seating positions 114. Based on selection signal received from the control circuitry 106, the audio signal source 102 provides the audio signal(s) to the audio signal processing circuitry 104, which may then provide the audio content to the appropriate speaker(s) 108.

The control circuitry 106 may include any processor, multiprocessor, or controller. The processor may be connected to a memory and a data storage element (e.g., data store 122). The memory stores a sequence of instructions coded to be executable by the processor to perform or instruct the various components discussed herein to perform the various processes and acts described in this disclosure. For instance, the control circuitry 106 may communicate with, and provide one or more control signals to, the audio signal source 102, the volume-based equalization circuitry 120, and the signal processor 118. Thus the memory may be a relatively high performance, volatile random access memory such as a dynamic random access memory (DRAM) or static memory (SRAM). However the memory may include any device for storing data, such as a disk drive or other nonvolatile storage device.

In additional examples, the processor may be configured to execute an operating system. The operating system may provide platform services to application software. These platform services may include inter-process and network communication, file system management, and standard database manipulation. One or more of many operating systems may be used, and examples are not limited to any particular operating system or operating system characteristic. In some examples, the processor may be configured to execute a real-time operating system (RTOS), such as RTLinux, or a non-real time operating system, such as BSD or GNU/Linux.

The instructions stored on the data storage (e.g., data store 122) may include executable programs or other code that can be executed by the processor. The instructions may be persistently stored as encoded signals, and the instructions may cause the processor to perform the functions and processes described herein. The data storage may include information that is recorded, on or in, the medium, and this information may be processed by the processor during execution of instructions. The data storage includes a computer readable and writeable nonvolatile data storage medium configured to store non-transitory instructions and data. In addition, the data storage includes processor memory that stores data during operation of the processor.

As discussed, in certain examples the audio system 100 may provide different audio content for different seating positions 114 within the vehicle cabin 112. That is, the audio source 102 may provide first audio content (e.g., a telephone conversation) for the first seating position 114a and second audio content (e.g., a movie sound track) for the second, third, and/or fourth seating position 114b, 114c, 114d. Each of the seating positions 114 may receive individual audio content, or receive shared audio content with another seating position 114. Once received, the respective speaker(s) 108 radiate the audio content to the corresponding seating position 114.

In certain examples, the seating positions 114 may be arranged in one or more audio content zones. Each seating position 114 within the same audio content zone receives the same audio content. For example, the first seating position 114a and the second seating position 114b may be designated as a first audio content zone, and the third seating position 114c and the fourth seating position 114d may be designated as a second audio content zone. Accordingly, the first and second seating positions 114a, 114b may receive audio content designated for the first audio content zone, and the third and fourth seating positions 114c, 114d may receive audio content designated for the second audio content zone. Each audio content zone may share the same audio source 102, or may have a separate audio content source. Moreover, each audio content zone may have more than one audio content source 102.

While each speaker 108 is intended to provide audio content to the seating position 114 proximate that speaker 108, it is appreciated that within enclosed spaces, such as the vehicle cabin 112, the provided audio content may reflect from surfaces proximate the speaker 108, and may be undesirably leaked to other seating positions. This is often the case when one seating position 114 is in a forward or rearward facing direction, or a sideways direction, of the seating position 114 that is intended to receive the audio content. For example, audio content provided by the speakers 108g, 108h may be undesirably leaked to one, or all, of the first, second, and third seating positions 114a, 114b, 114c. As discussed herein, this unintended acoustic reflection is referred to as leaked audio content.

While in some instances, recipients of the leaked audio content may enjoy receiving audio content intended for other listeners, generally, the leaked audio content is an inconvenience for those unintended recipients. In particular, the leaked audio content may interfere with other audio content actually intended for that listener, and may degrade the fidelity of that audio content. Moreover, other interference within the vehicle cabin 112 can further degrade the fidelity of audio content delivered to a seating position 114. In particular, speech content from other locations within the vehicle cabin 112 can destructively interfere with the audio content and make the audio content challenging to hear. This is especially the case when the speech content interferes with a telephone conversation provided to a seating position. Road noise and other noises within the vehicle cabin 112 (e.g., vehicle noise, ventilation noise, etc.) can have a similar effect on the audio content.

Accordingly, in various examples the audio signal processing circuitry 104 is configured to determine a perturbing signal which accounts for the interfering acoustic energy in the vehicle cabin 112, and adjust the audio content (e.g., a telephone conversation, one or more vehicle alerts or alarms, music, etc.) to compensate for the perturbing signal such that the audio content is clearly intelligible at the intended seating position 114. That is, the audio signal processing circuitry 104 is configured to adjust the audio content to mitigate the effects of the speech content, leaked audio content, and road noise, if present within the vehicle cabin 112, on the audio content at the desired seating position 114. Accordingly, in some instances the audio system 100 may isolate an occupant of a single seating position 114 (e.g., a driver's seat) from the destructive effects of acoustic interference.

In certain examples, the audio signal processing circuitry 104 is adapted to dynamically adjust the audio content based on the frequency components thereof to provide an improved listening experience at the desired seating position 114. While various acts and processes are described herein as being performed by the audio signal processing circuitry 104, it is appreciated that these acts and processes may be performed by the individual components of the audio signal processing circuitry 104 (e.g., the illustrated signal processor 118 and dynamic-volume control circuitry 120) and are described in this manner purely for the convenience of explanation.

In certain examples, the audio system 100 includes the microphone assemblies 110, each of which are positioned to detect speech or other audio content from a corresponding seating position 114 (i.e., a target location). However, as a result of the confined dimensions of many vehicle cabins, each of the microphone assemblies 110 may also detect other acoustic energy within the vehicle cabin. For instance, each microphone assembly 110 may detect speech content of a corresponding seating position (i.e., target speech content), leaked audio content, road noise, and speech content originating at other seating positions 114. As illustrated in FIG. 1, in one example the audio system 100 includes a first microphone assembly 110a positioned to detect speech content originating from the first seating position 114a, among other acoustic interference. Similarly, a second microphone assembly 110b may be positioned to detect speech content originating from the second seating position 114b, a third microphone assembly 110c may be positioned to detect speech content originating from the third seating position 114c, and a fourth microphone assembly 110d may be positioned to detect speech content originating from the fourth seating position 114d, among other acoustic interference.

While each illustrated as a single microphone assembly, in various examples each microphone assembly 110 may include one or more microphones. For instance, each microphone assembly 110 may include an array of microphones arranged in predetermined pattern. Each microphone may be an omnidirectional microphone, such as an omnidirectional electret microphone or an omnidirectional Microelectromechanical systems (MEMS) microphone. In another example, each microphone assembly 110 may include a directional microphone positioned to increase reception in a desired direction, and reject the acoustic energy arriving from other directions. Each microphone assembly 110 is in communication with the audio signal processing circuitry 104 (e.g., the signal processor 118) and configured to provide a corresponding microphone signal responsive to detection of the speech content, leaked audio content, road noise, and other acoustic energy.

Responsive to receiving the one or more microphone signals, the audio signal processing circuitry 104 is configured to determine the perturbing signal. As discussed herein, the perturbing signal refers to a summation of the acoustic energy which interferes with the audio content delivered to a desired seating position 114 within the vehicle cabin 112. That is, the perturbing signal refers to the summation of signals which may mask (e.g., render unintelligible) the delivered audio content. It is appreciated that the perturbing signal will be time-dependent and will vary during the operation of the audio system 100 (and vehicle).

According to various embodiments the perturbing signal can be represented as:

$$P_{total}(t) = \left(\sum_{k=1, k \notin D}^{K} P_k(t)\right) + \left(\sum_{k=1}^{K} M_k(t)\right) + N(t)$$

where, $P_{total}$ is the perturbing signal, t is the timeframe, k is a particular seating position 114 within the vehicle cabin 112, $P_k$ is the speech content for the particular seating position 114, D is the set of desired seating locations, $P_k$, k∉D, denotes the set of perturbing speech content signals to be measured, $M_k$ is the leaked audio content for the particular seating position 114, K is the number of seating positions 114 within the vehicle cabin 112, and N is the road noise. Once the perturbing signal is calculated, the audio signal processing circuitry 104 may adjust the audio content delivered to a desired seating position 114 such that the audio content is audible and the speech content, leaked audio content, and/or road noise do not affect the intelligibility of the audio content.

To determine the perturbing signal, in various examples the signal processor 118 determines a speech signal for the speech content originating from each seating position 114. However, often the microphone assemblies 110 will detect speech content originating from more than one seating position 114 within the vehicle cabin 112. Accordingly, the signal processor 118 may isolate the target speech content for each seating position. Moreover, the signal processor 118 is configured to further filter the microphone signals to isolate the speech content from the leaked audio content and road noise also detected by the microphone assemblies 110. Once filtered, the speech signal(s) remain, and the signal processor 118 may calculate the level (e.g., power) of each speech signal within the vehicle cabin 112, and sum the levels, to determine the total interference from speech content within the vehicle cabin 112.

As discussed herein, speech content may refer to the sustained delivery of vocal words or sounds from an occupant of the vehicle cabin 112 other than the occupant of the seating position 114 at which noise reduction is desired. For example, speech content may include words spoken by an occupant of the third seating position 114c when noise reduction is desired at the first seating position 114a. However, in certain other examples, speech content may include acoustic interference that is generated by an artificial source at a seating position 114 and that mimics organic speech content. For instance, speech content may include acoustic interference that originates from a cell phone, a mobile device, a tablet computer operating in a hands-free mode (i.e., not coupled to the control circuit 106) at a seating position 114. Accordingly, in some instances speech content may include other types of acoustic interference aside from a conversation between two occupants of the vehicle cabin 112.

To estimate each speech signal, the signal processor 118 may first filter each microphone signal to remove the road noise and leaked audio content. Since the audio content is received directly from the audio signal source 102, the leaked audio content may be identified and removed based on the known characteristics of the received audio content. The road noise may be identified and removed based on estimated characteristics of the noise in a similar manner. In one example, the signal processor 118 implements an acoustic echo canceller and noise reduction filter which use spectral subtraction to remove the road noise and leaked audio content.

Once the road noise and leaked audio content have been removed from each microphone signal, in many instances, the remaining components of the microphone signal are the speech content from a corresponding seating position 114 (i.e., the target speech content) and speech content originating at non-corresponding seating positions 114. To attenuate the speech content from the non-corresponding seating positions 114 and isolate the target speech content, in various examples the signal processor 118 treats all microphone assemblies 110 within the system 100 as a single array, and applies a beamforming configuration in either the time-domain or the frequency-domain. In particular, the signal processor 118 may select different predesigned beamforming configurations based on the particular combination of microphone signals that are received by the signal processor 118. Each beamforming configuration may consist of a set of weight vectors which are applied to reject and/or attenuate the speech content that is not the target speech content. According to an example, attenuation factors (or gain factors) that are associated with each beamforming configuration can be measured a priori and retrieved during the operation of the audio system 100.

In one example, a first beamforming configuration can be designed to detect target speech content originating at the first seating position 114a and reject or attenuate the speech content originating from the second seating position 114b, third seating position 114c, and/or fourth seating position 114d of the vehicle cabin 112. Similarly, a second beamforming configuration can be designed to detect speech content originating at the second seating position 114b and reject or attenuate speech content originating from the first seating position 114a, third seating position 114c, or fourth seating position 114d. Accordingly, when a microphone array is in use, the weight vector of the corresponding beamforming configuration allows that microphone array to steer its beam to receive the target speech content, and filter out or reduce the unwanted speech content. The attenuation (or gain) factors associated with each beamforming configuration specify the particular amount of attenuation (or gain) applied to the non-corresponding speech signals.

In one example, if beamforming is applied in the frequency-domain, each beamforming configuration may include a set of weight vectors, $w_f$, f=1, . . . , F. In the example, $w_f$ is the weight vector at a frequency, f, and F is the total number of frequencies. Accordingly, $w_f$ includes gains that are applied to the frequency components (at each frequency, f) of each microphone signal. A frequency component of the output may be obtained as the linear combination:

$$Y(f) = \Sigma w_{f,i} S_i(f)$$

where $S_i(f)$ is the frequency component of the signal at the ith microphone assembly 110 and $w_{f,i}$ is the associated gain.

In certain examples the weight vectors of each beamforming configuration may be obtained by applying a Minimum Variance Distortionless Response (MVDR) on different combinations of the received microphone signals. Once obtained, each set of weight vectors, along with the attenuation factors, may be stored in program storage accessible to the control circuitry 106 during operation. For instance, the plurality of weight vectors may be stored in a lookup table, a register, or similar reference table. The control circuitry 106 may use the look-up table to determine the appropriate beamforming configuration (e.g., set of weight vectors and attenuation factors) for a given condition during the operation of the vehicle cabin audio system 100, and provide the weight vectors and the attenuation factors to the audio signal processing circuitry 104. The look-up table may include any array that replaces a runtime computation with an indexing operation.

Owing to the fact that the speech content originating from each seating position 114 is largely uncorrelated, a system of linear equations, including the level of the speech signals, and the appropriate attenuation factors, may be formed. This system is then solved by the signal processor 118 on a timeframe basis to estimate the levels of the speech signals when a mixture (i.e., combination) of speech content is present. For example, the speech signals of the speech content may be denoted by $s_k$, i=1, ..., K, where K is the total number of seating positions 114 within the vehicle cabin. The corresponding levels of the speech signals may be denoted by $P_k$, and the number of beamforming configurations may be denoted by M. In such an example, a set of attenuation factors $\{\alpha_{m,k}, k=1, \ldots, K\}$ is associated with the mth beamforming configuration. The attenuation factors may be calculated, a priori, by measuring the input and output powers when different test signals are independently passed through the different beamforming configurations. The attenuation factor of the kth signal (target speech signal from kth seating position in this scenario), when passed through the mth beamforming configuration is denoted by $\alpha_{m,k}$, and computed using:

$$\alpha_{m,k} = \frac{P_{m,k}}{P_k},$$

where $P_{m,k}$ is the speech signal level at the output of the microphone assembly 110 when the mth configuration is used, and $P_k$ is the speech signal level of the kth speech signal.

Due to the fact that the speech content is largely uncorrelated, as discussed, the level of a linear combination of the speech signals is a linear combination of their levels, as shown in the following equation:

$$P_{in}(t) = \sum_{k=1}^{K} P_k(t)$$

where $P_{in}$ is the level of the combined mixture of the speech signals at a microphone assembly 110.

The timeframe over which the levels are computed is denoted by t. It should be noted that the correlation between the speech signals might not be zero if a small timeframe is used. That is, in certain examples as the timeframe increases the correlation approaches zero. For this reason, in certain examples the window length may be a tuning parameter for signal processor 118. After passing the combined signal through the mth beamforming configuration, the level of the output signal can be expressed as:

$$P_{out,m}(t) = \sum_{k=1}^{K} \alpha_{m,k} P_k(t)$$

Accordingly, a system of linear equations can then be formed by the signal processor 118 as follows:

$$\begin{bmatrix} P_{out,1}(t) \\ \vdots \\ P_{out,M}(t) \end{bmatrix} = \alpha \begin{bmatrix} P_1(t) \\ P_2(t) \\ \vdots \\ P_K(t) \end{bmatrix} = \begin{bmatrix} \alpha_{1,1} & \alpha_{1,2} & \cdots & \alpha_{1,K} \\ \vdots & \vdots & \ddots & \vdots \\ \alpha_{M,1} & \alpha_{M,2} & \cdots & \alpha_{M,K} \end{bmatrix} \begin{bmatrix} P_1(t) \\ P_2(t) \\ \vdots \\ P_K(t) \end{bmatrix}$$

and speech signal levels, at timeframe t, can then be estimated by the signal processor 118 as follows:

$$\begin{bmatrix} P_1(t) \\ P_2(t) \\ \vdots \\ P_K(t) \end{bmatrix} = \alpha^\dagger \begin{bmatrix} P_{out,1}(t) \\ \vdots \\ P_{out,M}(t) \end{bmatrix}$$

where, $\alpha^\dagger$ is the Moore-Penrose pseudoinverse of $\alpha$.

The discussed system of equations may be further extended, in other examples, to incorporate other types of acoustic interference within the vehicle cabin 112, such as the road noise and the leaked audio content. Different sets of weight vectors and attenuation factors can be constructed offline and may correspond to certain combinations of interfering acoustic energy. Then, depending on which of these combinations is detected, the corresponding beamforming configuration may be selected by the control circuitry 106, and applied by the signal processor 118.

As discussed above, the presence of certain audio content, such as leaked audio content, road noise, and other noise, can easily be determined by examining the audio signal source 102 outputs, a multimedia bus of the associated vehicle, and/or a vehicle Control Area Network (CAN). As for the speech signals, in certain examples the audio system 100 may further include one or more Voice Activity Detectors (VAD), each of which can be designed for a seating position 114 within the vehicle cabin 112. The one or more VADs may be coupled to the control circuitry 106 and may inform the control circuitry 106 when speech content is being generated at a given seating position 114. While the signal level calculations of the speech content are based on the location of the microphone assemblies, 110 and not the location at which isolation is desired, discrepancies can be compensated by measuring a priori the difference in the levels of the acoustic interference at these locations, and adjusting the audio content accordingly.

Once determined, the speech signal(s) may be combined with the leaked audio content and the road noise to determine the total perturbing signal, as discussed above. In certain examples, the leaked audio content from each seating position 114 may be determined based the audio signal(s) provided to the audio signal processing circuitry 104 and one or more leakage functions. Each leakage function may correspond to a spatial relationship between the speakers 108 which leak the audio content and the seating position 114 at which the leaked audio content is received. Since this relationship is fixed and may be determined during the production of the vehicle, for example, each of the leakage functions may be predetermined and stored in the data store 122. Similar processes may be performed by the signal processor 118 for the road noise during operation of the vehicle.

As discussed herein, the audio signal processing circuitry 104 may adjust an audio signal to compensate for the perturbing signal. This may include compensating for one or all of the various sources of acoustic interference within the vehicle cabin 112. In one example, the audio signal processing circuitry 104 includes volume-based equalization circuitry 120 which dynamically adjusts a level of an audio signal, based on a frequency of the audio signal, to compensate for the perturbing signal. Specifically, the volume-based equalization circuitry 120 may dynamically adjust a balance between frequency components of the audio signal, independently or in frequency bands, to mitigate the effects of the perturbing signal at the desired seating position 114. For instance, the volume-based equalization circuitry 120 may include one or more linear filters or dynamic gain circuitry which amplifies or attenuates the frequency components of the audio signal.

In one example, the level of adjustment (e.g., gain or attenuation adjustment) made to the audio signal may be based on an adjustment curve selected from among a group of adjustment curves. Each adjustment curve specifies the gain or attenuation to be applied to the audio signal based on the frequency components thereof. In particular, adjustment values within each adjustment curve may correspond to a Signal-to-Noise Ratio for each frequency component, or frequency band. Based on the received desired audio content, and a calculated SNR, the audio signal processing circuitry 104 may select the appropriate adjustment curve, and apply the appropriate adjustment value(s) to dynamically adjust the desired audio content to mitigate the effects of the perturbing signal. In particular instances, frequency-based adjustments to the audio signal may be performed by executing the techniques described in U.S. Pat. Pub. No. 2015/0281864, titled "DYNAMIC SOUND ADJUSTMENT", which is hereby incorporated by reference herein in its entirety. Once adjusted, the volume-based equalization circuitry 120 provides the audio signal to the corresponding speakers 108.

In one example, the volume-based equalization circuitry 120 is configured to apply a different amplification or attenuation for different frequency bands of the audio content. For instance, the volume-based equalization circuitry 120 may apply a first attenuation or amplification to a first frequency band (e.g., a low frequency band) and apply a second attenuation or amplification to a second frequency band (e.g., a high frequency band). In such an example, the low frequency band may include frequencies between 50 Hz and 500 Hz and the high frequency band may include frequencies between 500 Hz and 5 kHz. Amplification and/or attenuation adjustment values for each frequency band may be specified by a selected adjustment value, as discussed above.

As discussed herein, certain examples of the vehicle cabin audio system 100 may provide significant benefits when a telephone conversation is played to a single seating position within a noisy vehicle cabin. For instance, referring to FIG. 1, the audio signal processing circuitry 104 may provide an adjusted telephone conversation to the occupant of the first seating position 114a, which mitigates the effects of speech content originating at any or all of the second seating position 114b, the third seating position 114c, and the fourth seating position 114d. In addition to adjusting the telephone conversation to compensate for the speech content, the audio signal processing circuitry 104 may further adjust the telephone conversation to mitigate the effects of other audio content within the cabin 112 (e.g., music) and vehicle noise.

Figure 2:
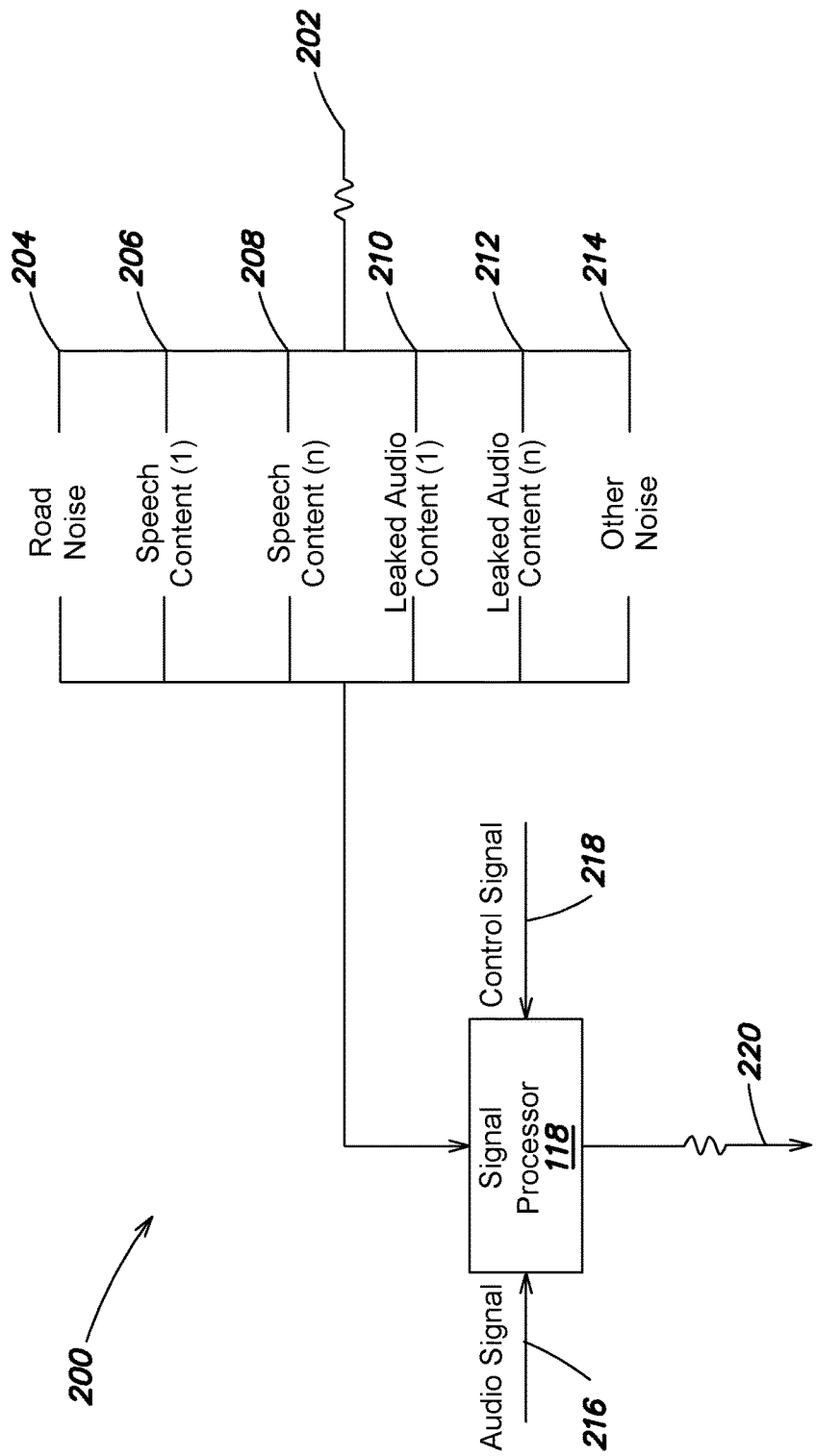
FIG. 2 is an input/output diagram of the signal processor illustrated in FIG. 1, according to various examples.

Referring to FIG. 2, illustrated is one example of an input/output diagram of the signal processor illustrated in FIG. 1. As shown, the signal processor 118 may receive a microphone signal which includes a road noise component 204, a speech content component 206, a leaked audio content component 210, and an other noise component 214 (e.g., vehicle noise, ventilation noise, etc.). As discussed with reference to the audio system 100 of FIG. 1, in certain examples the microphone signal may include detected speech content originating at more than one seating position and leaked audio content originating at more than one speaker. Accordingly, in FIG. 2 the microphone signal is shown as also including an additional speech content component (n) 208 and an additional leaked audio content component (n) 212.

As further illustrated, the signal processor 118 may also receive an audio signal 216 from the audio signal source 102 and one or more control signal 218 from the control circuitry 106. Based on at least these signals, and the microphone signal 202, the signal processor 118 may determine the perturbing signal 220. The determined perturbing signal 220 may then be provided to the other components of the audio signal processing circuitry 104 illustrated in FIG. 1, such as the volume-based equalization circuitry 118.

Figure 3:
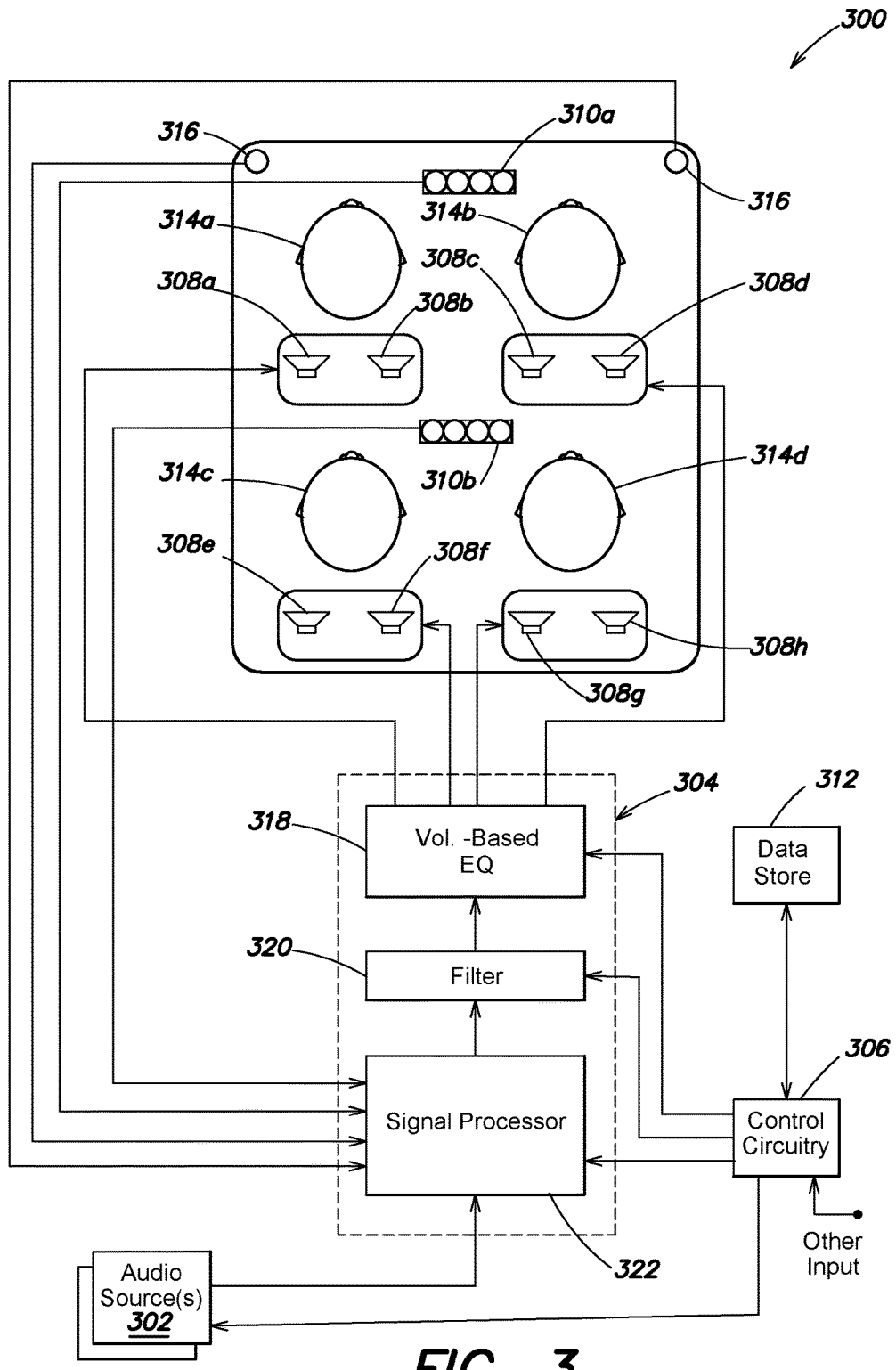
FIG. 3 is another schematic view of a vehicle cabin audio system according to various examples.

Referring now to FIG. 3, illustrated is another example of a vehicle cabin audio system 300. As illustrated, the vehicle cabin audio system 300 of FIG. 3 may include many of the same components as the audio system 100 described with reference to FIG. 1. For instance, the audio system 300 may include an audio signal source 302, audio signal processing circuitry 304, control circuitry 306, one or more speakers 308a-h, one or more microphone assemblies 310a-b, and a data store 312, among other components. Each of the speakers 308 may be positioned proximate a corresponding seating position 314a-d, as also discussed with reference to the vehicle cabin audio system 100 of FIG. 1. Unless otherwise specified, the one or more speakers 308a-h are generally referred to as speakers 308, the one or more microphone assemblies 310a-b are generally referred to as microphone assemblies 310, and the seating positions 314a-d are generally referred to as seating positions 314.

According to certain examples, each microphone assembly 310 may include an array of individual microphones. While in the example illustrated in FIG. 1, each microphone assembly 310 is positioned to detect speech content originating at a corresponding seating position 314, in certain other examples, each seating position 314 may not have a corresponding microphone assembly 310, and instead, share one or more common microphone assemblies 310. For instance, FIG. 3 shows a first microphone assembly 310a positioned to detect speech content originating at the first and second seating positions 314a, 314b and a second microphone assembly 310b positioned to detect speech content originating at the third and fourth seating positions 314c, 314d. In certain examples, each microphone assembly 310 may be positioned at a central location between the respective seating positions 314, as shown in FIG. 3.

Each microphone assembly 310 may distinguish between the speech content originating at the different seating positions 314 based on a direction at which the speech content is received at the microphone assembly 310. That is, as a result of the central location of each microphone assembly 310, speech content from each seating position 314 will be received at the microphone assemblies 310 in a different direction. Specifically, the speech content waveforms will propagate along the individual microphones of the microphone assembly 310 in a different order. Based on the delay between when each microphone in the assembly detects the speech content, the audio signal processing circuitry 304 may determine the originating seating position 314 of the detected speech content.

As also shown in FIG. 3, the audio signal processing circuitry 304 may further receive one or more noise signals from one or more road noise sensors 316. Each road noise sensor 316 may be positioned within the vehicle cabin to detect road noise during the operation of the vehicle. For instance, each road noise sensor 316 may also include a microphone. Noise signals from each road noise sensor 316 may be used to filter each microphone signal as further discussed with reference to the vehicle cabin audio system 100 illustrated in FIG. 1.

In certain examples, the audio signal processing circuitry 304 includes dynamic volume-equalization circuitry 318 coupled to one or more filters 320 and a signal processor 322. Each filter 320 may receive one or more control signals from the control circuitry 306 which adjusts the parameters of the filters 320 (e.g., a filter coefficient). While in one example, each filter 320 may be controlled to filter leaked audio content from the microphone signals and provide cross-talk cancellation, in various other examples, each filter 320 may reduce or remove other acoustic interference within the vehicle cabin, such as road noise or vehicle noise. In particular examples, each filter 320 may include a cross-talk cancellation filter which provides an amplitude adjusted audio signal to the dynamic volume-based equalization circuitry 318.

Figure 4:
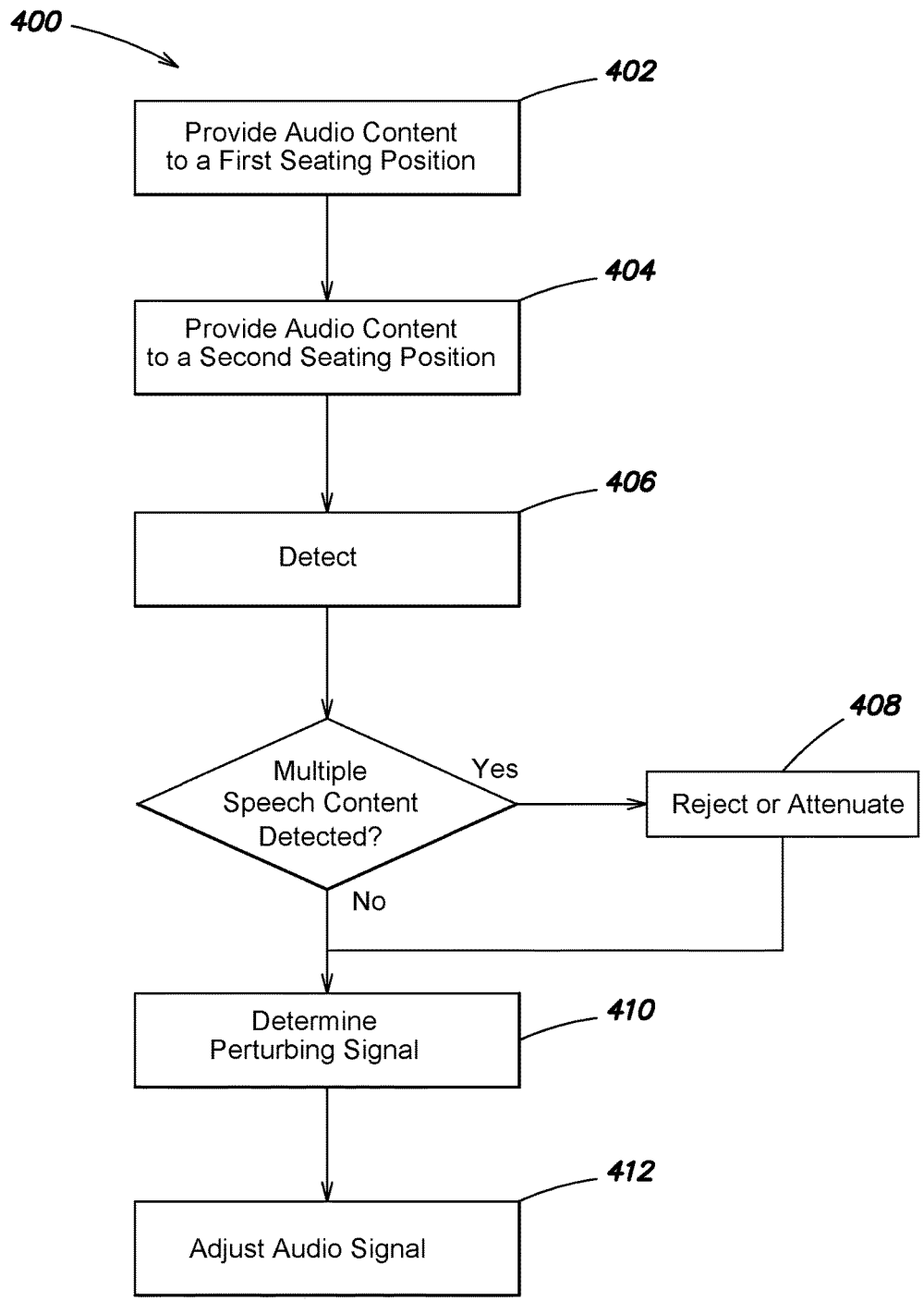
FIG. 4 is a process flow for operating a vehicle cabin audio system, according to various examples.

As described above with reference to at least FIG. 1, several examples perform processes that compensate for the effects of acoustic interference at a desired seating position within a vehicle cabin. In some examples, these processes are executed by vehicle cabin audio system, such as the audio system 100 described above with reference to FIG. 1. One example of such a process is illustrated in FIG. 4. According to this example, the process 400 includes the acts of providing audio content to a first seating position based on an audio signal, providing audio content to a second seating position, detecting speech content, leaked audio content, and road noise, determining a perturbing signal based on the detected speech content, leaked audio content, and road noise, and adjusting the audio signal to compensate for an effect of the perturbing signal on the audio content provided to the first seating position. The process 400 of FIG. 4 is described with continuing reference to the audio system 100 illustrated in FIG. 1, and the components thereof.

In act 402, the process 400 first includes providing first audio content to a first seating position (e.g., seating position 114a in FIG. 1) within a vehicle cabin based on an audio signal received from an audio signal source. For instance, in act 402 the process may include providing a telephone conversation from the speakers 108a, 108b to the first seating position 114a (shown in FIG. 1). In certain examples, providing audio content to a seating position may include driving one or more speaker(s) proximate the seating position (e.g., within a headrest, a seat back, an armrest, a cabin door, a headliner, and/or an instrument panel) with a processed audio signal and radiating acoustic energy to an occupant of the seating position.

In certain examples, the audio system may provide different audio content for different seating positions, or different audio content zones, within the vehicle cabin. That is, the audio source may provide first audio content (e.g., the telephone conversation) for the first seating position 114a and second audio content (e.g., a movie sound track) for a second, third, and/or fourth seating position (e.g., seating positions 114b, 114c, 114d in FIG. 1). Once received, the respective speaker(s) radiate the audio content to the corresponding seating position. Accordingly, at the same time, or at about the same time, the first audio content is being delivered, the process 400 may include providing second audio content to the second seating position (act 404) within the vehicle cabin with a second speaker. Similarly, the process 400 may include providing the second audio content to a third seating position, or providing third audio content to the third seating position. In at least one example, the second audio content and the third audio content is different from the first audio content.

In act 406 the process 400 includes detecting, at a microphone assembly, speech content originating at the second seating position, leaked second audio content from one or more speakers near the second seating position, and road noise. Once detected, the process 400 may then include determining a perturbing signal based at least in part on a combination of the speech content, the leaked second audio content from the second speaker, and the road noise (act 410). Once the perturbing signal is calculated, the process 400 may include adjusting the audio signal provided to the first speaker based on a frequency of the audio signal to compensate for an effect of the perturbing signal on the audio content at the first seating position (act 412).

As discussed herein, in many instances each microphone assembly may detect speech content originating from multiple seating positions. That is, in addition to detecting the speech content originating from a corresponding seating position (e.g., target speech content), each microphone assembly may detect the speech content originating at non-corresponding seating positions. For instance, the third microphone assembly 110c illustrated in FIG. 1 may detect speech content originating at the third seating position 114c, as well as, speech content originating at the fourth seating position 114d. Accordingly, the process 400 may further include the act of distinguishing the detected speech content originating at the corresponding seating position (e.g., target speech content) from the speech content received from non-corresponding seating positions, and rejecting or attenuating the undesired speech content (act 408). However, it is appreciated that such acts may not be necessary if speech content is detected from only one seating position.

To attenuate speech content from non-corresponding seating positions, one or more acts may be performed to treat all microphone assemblies of the system as a single array. For instance, if speech content originating from multiple seating positions is detected by a microphone assembly, the process 400 may include selecting and applying a beamforming configuration in either the time-domain or the frequency-domain to the detected mixture of speech. In a situation where multiple microphone assemblies each detect speech content from a corresponding seating position, as well as, speech content corresponding to other seating positions, a separate beamforming configuration may be applied to the microphone signal of each individual microphone assembly.

In particular examples, the process 400 may include selecting a different predesigned beamforming configuration for each microphone assembly based on the particular combination of microphone signals that are present. As discussed with reference to at least FIG. 1, each beamforming configuration may consist of a set of weight vectors which are applied to reject and/or attenuate the speech content that is not the target speech content of a given microphone assembly. Accordingly, when a microphone assembly is in use, the weight vector of the corresponding beamforming configuration allows that microphone array to steer its beam to receive the target speech content, and filter out or reduce the unwanted speech content. Attenuation (or gain) factors associated with each beamforming configuration specify the particular amount of attenuation applied to the non-corresponding speech signals. Once the appropriate beamforming configuration has been applied, all undesired speech content is rejected or attenuated and a speech signal for the target speech content remains.

Each speech signal may be combined with the leaked audio content and the road noise to determine the total perturbing signal, as discussed above. Referring to act 412, the process 400 may include adjusting the audio signal provided to the first speaker to compensate for the effects (e.g., masking effects) of the perturbing signal on the audio content. This may include compensating for one or all of the various sources of acoustic interference within the vehicle cabin. In one example, the process 400 includes dynamically adjusting a level of the audio signal based on a frequency of the audio signal to mitigate the effects of the perturbing signal. Specifically, process 400 may include dynamically adjusting the balance between frequency components of the audio signal, independently or in one or more frequency bands, such that the perturbing signal has substantially no effect on the intelligibility of the audio content at the desired seating position.

While FIG. 4 illustrates one example of a process for reducing acoustic interference at a desired seating position within a vehicle cabin, the process may further include additional acts not explicitly illustrated in FIG. 4 for the convenient of explanation. Such acts are discussed and described herein with reference to one or more of FIGS. 1, 2, and 3.

Having described above several aspects of at least one implementation, it is to be appreciated various alterations, modifications, and improvements will readily occur to those skilled in the art. Such alterations, modifications, and improvements are intended to be part of this disclosure and are intended to be within the scope of the description. Accordingly, the foregoing description and drawings are by way of example only, and the scope of the disclosure should be determined from proper construction of the appended claims, and their equivalents.

What is claimed is:

1. A vehicle cabin audio system comprising:
   a first speaker positioned to provide first audio content to a first seating position within a vehicle cabin based on an audio signal received from an audio signal source;
   a second speaker positioned to provide second audio content to a second seating position within the vehicle cabin;
   a first microphone assembly positioned to detect first speech content originating at the second seating position, leaked second audio content from the second speaker, and road noise;
   a second microphone assembly positioned to detect at least second speech content originating at a third seating position, the second speech content being different from the first speech content, wherein each of the first microphone assembly and the second microphone assembly includes an array of microphones; and
   audio signal processing circuitry coupled to at least the first microphone assembly and the second microphone assembly, the audio signal processing circuitry being configured to filter the leaked second audio content from the second speaker and the road noise to isolate the first speech content, and determine a perturbing signal based at least in part on a combination of the first speech content, the second speech content, the leaked second audio content from the second speaker, and the road noise, and wherein the audio signal processing circuitry is configured to adjust the audio signal to the first speaker based on a frequency of the audio signal to compensate for an effect of the perturbing signal on the first audio content at the first seating position.

2. The vehicle cabin audio system of claim 1, wherein the second audio content is different from the first audio content, and wherein the second seating position is in one of a forward facing direction, a rearward facing direction, a first sideways facing direction, or a second sideways facing direction of the first seating position.

3. The vehicle cabin audio system of claim 1, wherein the first microphone assembly is further configured to detect the second speech content, and wherein the audio signal processing circuitry is configured to distinguish the first speech content detected by the first microphone assembly from the second speech content detected by the first microphone assembly based on a direction of each of the first speech content and the second speech content relative to the first microphone assembly.

4. The vehicle cabin audio system of claim 1, wherein the first microphone assembly is further configured to detect the second speech content, and wherein the audio signal processing circuitry is further configured to select and apply a first beamforming configuration to attenuate the second speech content detected by at least the first microphone assembly.

5. The vehicle cabin audio system of claim 4, wherein the beamforming configuration includes at least a set of weight vectors, and wherein in applying the first beamforming configuration the audio signal processing circuitry is configured to apply the set of weight vectors to a combination of the first speech content and the second speech content.

6. The vehicle cabin audio system of claim 5, further comprising a data store including a look-up table having a plurality of beamforming configurations, wherein the audio signal processing circuitry is configured to reference the look-up table to select the first beamforming configuration from among the plurality of beamforming configurations.

7. The vehicle cabin audio system of claim 1, wherein the audio signal processing circuitry includes volume-based equalization circuitry configured to control an attenuation or amplification applied to the audio signal to the first speaker to adjust the audio signal to compensate for the effect of the perturbing signal.

8. The vehicle cabin audio system of claim 7, wherein the audio signal includes at least a first frequency band and a second frequency band, and the volume-based equalization circuitry is configured to control a first attenuation or amplification applied to the first frequency band and a second attenuation or amplification applied to the second frequency band, the first attenuation or amplification being different from the second attenuation or amplification.

9. The vehicle cabin audio system of claim 7, wherein the volume-based equalization is configured to control an attenuation or amplification applied to the audio signal independently for each frequency of the audio signal.

10. The vehicle cabin audio system of claim 1, wherein the first seating position is a driver's seat within the vehicle cabin, and wherein the first audio content is a telephone conversation.

11. A vehicle cabin audio system comprising:
    a first speaker positioned to provide first audio content to an occupant within a vehicle cabin based on an audio signal received from an audio signal source;
    a first microphone assembly positioned to detect first speech content originating at a first seating position within the vehicle cabin, second speech content originating at a second seating position within the vehicle cabin, road noise, and leaked audio content;

a second microphone assembly positioned to detect at least the second speech content, the second speech content being different from the first speech content, wherein each of the first microphone assembly and the second microphone assembly includes an array of microphones; and audio signal processing circuitry coupled to each of the first and second microphone assemblies and configured to filter the leaked audio content and the road noise to isolate the first speech content, the audio signal processing circuitry being further configured to estimate at least a first speech signal for the first speech content originating at the first seating position and at least a second speech signal for the speech content originating at the second seating position, and wherein the audio signal processing circuitry is configured to adjust the audio signal to compensate for an effect of the estimated first speech signal for the first speech content, and the estimated second speech signal for the second speech content, on the first audio content.

12. The vehicle cabin audio system of claim 11, wherein the audio signal processing circuitry is configured to select and apply a first beamforming configuration to a combination of the first speech content and the second speech content detected by at least the first microphone assembly.

13. The vehicle cabin audio system of claim 12, wherein the first beamforming configuration includes at least a first set of weight vectors, and wherein in applying the first beamforming configuration the audio signal processing circuitry is configured to apply the first set of weight vectors to the combination of the first speech content and the second speech content to reject or attenuate the second speech content.

14. The vehicle cabin audio system of claim 13, wherein the audio signal processing circuitry is configured to select and apply a second beamforming configuration to a combination of the first speech content and the second speech content detected by at least the second microphone assembly.

15. The vehicle cabin audio system of claim 14, wherein the second beamforming configuration includes a second set of weight vectors, and wherein in applying the second beamforming configuration the audio signal processing circuitry is configured to apply the second set of weight vectors to the combination of the first speech content and the second speech content to reject or attenuate the first speech content.

16. The vehicle cabin audio system of claim 11, wherein the audio signal processing circuitry includes volume-based equalization circuitry configured to control an attenuation or amplification applied to the audio signal to the first speaker to compensate for the effect of the estimated first speech signal and the estimated second speech signal.

17. A method of operating a vehicle cabin audio system, the method comprising:

providing first audio content to a first seating position within a vehicle cabin, with a first speaker, based on an audio signal received from an audio signal source;

providing second audio content to a second seating position within the vehicle cabin with a second speaker;

detecting, at a first microphone assembly, first speech content originating at the second seating position, leaked second audio content from the second speaker, and road noise;

detecting, at a second microphone assembly, second speech content originating at a third seating position, the second speech content being different from the first speech content;

filtering the leaked second audio content from the second speaker and the road noise to isolate the first speech content;

determining a perturbing signal based at least in part on a combination of the first speech content, the second speech content, the leaked second audio content from the second speaker, and the road noise; and adjusting the audio signal based on a frequency of the audio signal to compensate for an effect of the perturbing signal on the first audio content at the first seating position.

18. The method of claim 17, further comprising:

detecting, at the first microphone assembly, the second speech content; and distinguishing between the first speech content detected by the first microphone assembly and the second speech content detected by the first microphone assembly based on a direction of each of the first speech content and the second speech content relative to the first microphone assembly.

19. The method of claim 17, further comprising:

detecting, at the first microphone assembly, the second speech content; and selecting and applying a first beamforming configuration to attenuate the second speech content detected by at least the first microphone assembly.

20. The method of claim 19, wherein applying the first beamforming configuration includes applying a set of weight vectors to a combination of the first speech content and the second speech content to reject or attenuate the second speech content.

21. The method of claim 17, wherein the audio signal includes at least a first frequency band and a second frequency band, and wherein adjusting the audio signal includes controlling a first attenuation or amplification applied to the first frequency band and a second attenuation or amplification applied to the second frequency band, the first attenuation or amplification being different from the second attenuation or amplification.

22. The method of claim 17, wherein adjusting the audio signal includes controlling an attenuation or amplification applied to the audio signal independently for each frequency of the audio signal.

* * * * *